United States Patent [19]

Frese

[11] Patent Number: 4,475,229

[45] Date of Patent: Oct. 2, 1984

[54] DEVICE FOR PRODUCING ARTIFICAL REVERBERATION

[75] Inventor: Stefan Frese, Vienna, Austria

[73] Assignee: AKG-Akustische u.Kino-gerate gesellschaft m.b.H., Austria

[21] Appl. No.: 354,083

[22] PCT Filed: Apr. 23, 1981

[86] PCT No.: PCT/AT81/00009

§ 371 Date: Jan. 29, 1982

§ 102(e) Date: Jan. 29, 1982

[87] PCT Pub. No.: WO81/03566

PCT Pub. Date: Dec. 10, 1981

[30] Foreign Application Priority Data

May 29, 1980 [AT] Austria .......... 2859/80
Mar. 26, 1981 [AT] Austria .......... 1418/81

[51] Int. Cl.³ .......... G06F 15/34; H03H 7/10
[52] U.S. Cl. .......... 381/63; 84/DIG. 26
[58] Field of Search .......... 381/61, 62, 63; 84/1.24, 1.25, DIG. 26; 333/23

[56] References Cited

U.S. PATENT DOCUMENTS 3,967,099 6/1976 Fettweis .
3,992,582 11/1976 Osakabe .
4,215,242 7/1980 Gross .
4,219,880 8/1980 Nichols .......... 381/63 X
4,371,748 2/1983 Dijkmans et al. .......... 381/63

FOREIGN PATENT DOCUMENTS 2027303 12/1971 Fed. Rep. of Germany .
2360983 6/1975 Fed. Rep. of Germany .
2719276 11/1978 Fed. Rep. of Germany .
2047508 11/1980 United Kingdom .

OTHER PUBLICATIONS

"A New Type of Wave Digital Filter", Swanny et al., *Jour. of the Franklin Inst.*, vol. 300, No. 1, Jul. 1975, pp. 41–58.

*Primary Examiner*—G. Z. Rubinson
*Assistant Examiner*—Keith E. George
*Attorney, Agent, or Firm*—McGlew and Tuttle

[57] ABSTRACT

In a device for producing artificial reverberation by means of a one-dimensional waveguide, a one-dimensional waveguide is utilized, which is obtained using digital circuits which contain at least two line sections of different length, each line section consisting of two parallel digital delay arrangements, one for each direction of propagation. At least one three-gate adapter of the digital wave filter type is arranged between two line sections lying side by side, each of two gates of the three-gate adapter being connected with one of the two mutually facing ends of these two line sections, and the dependent gate of the three-gate adapter being terminated with a frequency-dependent absorber of the digital type. By using a digital one-dimensional waveguide with discontinuities and absorbers, it is possible to reverberate a signal diffusely and with a programmable frequency response of the reverberation time without the disadvantage of a reduced sound to noise ratio due to limit cycles.

20 Claims, 16 Drawing Figures

DEVICE FOR PRODUCING ARTIFICAL REVERBERATION

FIELD AND BACKGROUND OF THE INVENTION

The present invention relates to a device for producing artificial reverberation by means of a one-dimensioned waveguide. Such a device is known from Austrian Pat. Nos. 279,203 and 292,332 (U.S. Pat. Nos. 3,566,310 and 3,697,059).

Devices for the production of artifical reverberation resolve the unreverberated signal dispersively in a random manner. Such devices should, therefore, have a dense, irregular pole/zero distribution in the frequency spectrum to prevent flutter echo and tone shading. Preferably the frequency response of the reverberation time should decrease with increasing frequency.

In addition to the known devices for producing artificial reverberation, such as the reverberant chamber, the plate reverberator and the torsional vibration waveguide, it has become possible in recent times to construct electronic reverberation-producing devices using digital techniques. The advantages of digital devices for the production of artificial reverberation over the conventional electromechanical reverberators are their independence of environmental factors, the programmability of all reverberation parameters, their mechanical sturdiness, and the possibility of integrating them into the digital equipment of a sound studio.

For digital production of artificial reverberation, the use of rapid computers or digital signal processors is known, which simulate the transmission behavior of a room in real time. Such a signal processor consists of an analog/digital converter, which samples the unreverberated input signal and converts it into pulse code modulation, a high speed computer specifically designed for the reverberation which processes the coded sampled data, and a digital/analog conveter which reconverts the computer results into a continuous signal. Until now, reverberation equipment has become known in which high-quality resonators are simulated digitally. A loop composed of a digital delay arrangement, a digital damping element, and an adder is used as a resonator. The feedback is effected by multiplication of the feedback signal by a damping factor, which for reasons of stability must be less than 1. The pulse response is a periodical, exponentially decaying pulse sequence, and the frequency response meets the requirements of a periodical comb filter whose natural resonances occur as integral multiples. This periodicity is the main disadvantage of the resonators, and with long loop delays produces a flutter echo and, with short loop delays, a strong tone color. According to the state of the art, there are the following possibilities for weakening these two undesirable effects:

(1) Tapping the loop delay arrangement at several points, multiplying the signals occurring at the taps by different coefficients, and combining them additively as one output signal.

An equivalent circuit is a series-connected comb filter with irregular frequency response, which diminishes the tone color or timbre of the sound.

(2) Using several parallel- and/or series-connected, different resonators, the individual tone colors mask each other to a certain extent.

(3) Supplementing the arrangement described under point 2 by a feedback loop. This results in a reverberation system with multiple feedback and irregular natural resonance distribution. However, such a circuit structure can be realized only using analog filter techniques. In digital filter techniques, a disturbance referred to as a limit cycle occurs. Limit cycles are numerical instabilities which are caused by a buildup of the rounding error, which is inevitable in a multiplication. They are noticed as soft whistling sounds, which do not disappear even after the signal which triggered them has decayed.

Another disadvantage of resonator reverberation is that the reverberation time frequency response is flat and cannot be influenced. Digital resonators, in fact, have the property that all their natural resonances decay equally fast.

SUMMARY OF THE INVENTION

It is an object of the invention to provide an electronic device for producing artificial reverberation which, using digital circuit arrangements, does not have the disadvantages of the known devices.

More specifically, it is an object of the invention to provide a dimensional waveguide, such as a waveguide realized with digital technology circuits, which contains at least two line sections of different length, each line section consisting of two parallel digital delay lines, one for each direction of propagation, and that further at least one three-gate adapter of the digital wave filter type is arranged between two line sections lying side by side, each of two gates of the three-gate adapter being connected with one of the two mutually facing ends of these two line sections, and the dependent gate of at least one three-gate adapter being terminated with a frequency-dependent absorber realized by using digital techniques.

Accordingly, the device of the invention for producing artificial reverberation comprises a digital waveguide which consists of many loss-free sections of different length with equal propagation constants, and over whose total length several frequency-dependent absorbers are distributed. To produce reverberation, the one-dimensional waveguide is energized with the signal to be reverberated, which propagates thereon at constant speed. If it arrives at a junction of a three-gate adapter between two line sections, the signal in the three-gate adapter is not only attenuated but also divided into a passing and a reflected component. This is repeated until only reflected components remain. The absorbers which terminate the three-gate adapters are loss resistances inserted in the one-dimensional waveguide and are bridged by capacitances or inductances for controlling their frequency response. Thus these absorbers determine the reverberation time frequency response of the device.

The advantages of the invention may be summarized as follows:

(a) Due to the mutual coupling of the line sections corresponding to the resonators of the conventional digital reverberators, integral frequency multiples of the natural resonances do not occur.

(b) Despite the close coupling of the resonators, limit cycles are not possible.

(c) Through the absorbers it is possible to influence the frequency responses of the reverberation time.

Three-gate adapters are known from German DE-OS No. 20 27 303, see FIGS. 18 and 20. But that publication does not show a device for producing artificial reverberation.

As another possibility, the device for producing artificial reverberation may further contain at least one two-gate adapter of the digital wave filter type, arranged between two line sections lying side by side, each of the two gates of the two-gate adapter being connected with one of the two mutually facing ends of these two line sections. In this manner, too, reflection at one point can be achieved. Further, line sections of different wave resistance can be realized.

Again it should be mentioned that two-gate adapters are known from DE-OS No. 20 27 303, see FIG. 15 (corresponds to U.S. Pat. No. 3,976,099, FIG. 30). A preferred form of the device according to the invention is characterized in that the two ends of the waveguide are connected together, possibly with insertion of a two-gate adapter or a three-gate adapter. By providing a "circular" design of the device for producing artificial reverberation, a still much better diffusivity of the reverberation can be achieved, because not only are the two directions of propagation coupled to each other via the three-gate adapters and/or the two-gate adapters, but also each direction of propagation in itself is coupled in feedback. The input of a non-"circular" form of the device of the invention is such that the device is provided with an input terminal by means of an adder unit, the output of this adder unit being connected with the input for one direction of propagation at one end of the waveguide and the output for the other direction of propagation at the same end of the waveguide with a second input of the adder unit.

The output of this form of the invention is such that, at the other end of the waveguide the output is provided with an output terminal which is connected with the input at the same end of the waveguide either with insertion of an absorber or directly.

The input of a "circular" form of the device of the invention is such that between two line sections lying side by side a first and a second adder unit is provided, one for each direction of propagation, where for each direction of propagation the output of the delay line of one line section is connected to a first input of the adder unit and the output of this adder unit is connected to the input of the delay line of the other line section, and an input signal can be supplied to a second input of both adder units.

The output of this "circular" form is designed according to the invention in such a way that, seen in one direction of propagation, the output of a delay line of a line section is connected to a first input of a third adder unit and viewed in the other direction of propagation the output of a delay line of a line section is connected to a second input of the third adder unit, the output signal being available at an output of this third adder unit.

In a preferred form of the "circular" device according to the invention, the two input signals for the two inputs of the third adder unit are tapped from the delay lines in such a way that the time delay between the first adder unit and the third adder unit seen in the respective direction of propagation is equal to the delay time between the second adder unit and the third adder unit seen in the opposite direction of propagation. This symmetrical design has the advantage that the unreverberated signal and its echoes occurring periodically with the delay of the transit time in the device, can be compensated. To this end, the reverberated signals tapped from the third adder unit are supplied to a differential amplifier, so that after the difference formation essentially only diffuse signal components are present.

The frequency-dependent absorber may correspond to a one-gate circuit composed of a parallel connection of the digital type, of an ohmic resistance and a capacitance. The frequency-dependent absorber may alternately correspond to a one-gate circuit which is formed by a series connection of the digital type, of an ohmic resistance and a capacitance or of an ohmic resistance and an inductance. A digital one-gate circuit which obtains the parallel connection of an ohmic resistance and an inductance may consist, for example, of a chain composed of an adder, a delay section, a multiplier, and a second adder, the output of the multiplier being connected to the second input of the first adder and the output of the delay section being connected via a sign inverter with the second input of the second adder.

Another variant for simulating the parallel connection of an ohmic resistance and a capacitance has the same chain connection as described above, but it differs in that a sign inverter is inserted between the first adder and the delay section.

The series connection of an ohmic resistance and a capacitance can be obtained by a digital one-gate circuit consisting of a chain composed of an adder, a multiplier, a second adder, a sign inverter and a delay section, the output of the one-gate circuit being connected via a sign inverter to the second input of the first adder, and the input of the one-gate circuit being connected via a sign inverter to the second input of the second adder.

A further possibility of the digital simulation of the series connection of an ohmic resistance and an inductance by means of a digital one-gate circuit differs from the above described chain connection in that the output of the second adder is connected directly to the input of the delay section.

BRIEF DESCRIPTION OF THE DRAWINGS

Further details of the invention will be explained below with reference to the drawing, in which.

DESCRIPTION OF THE PREFERRED EMBODIMENTS

Figure 1:
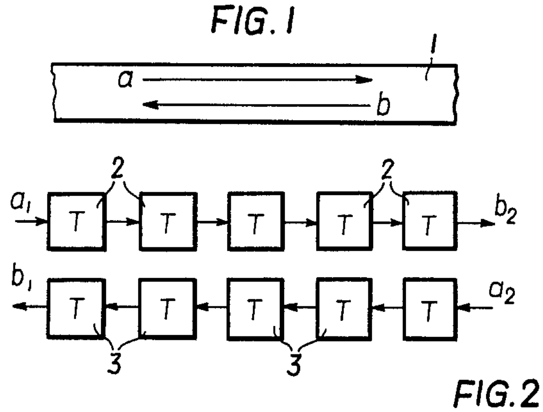
FIG. 1 is a diagram of a line section of a digitally realized one-dimensional waveguide.

Referring to the drawings, FIG. 1 shows the propagation of signals on a one-dimensional waveguide and a digital circuit thereof according to the invention. As a waveguide 1 transmits the signals in both directions, its digital circuit consists of two parallel delay arrangements, the delay sections 2 (labelled T) transmitting the signal propagating from left to right while the delay sections 3 transmit the signal propagating from right to left. The signals entering the line sections in the forward direction are marked a1 and a2, the signals leaving the line section (reflected signals) are marked b1 and b2.

Figure 2:
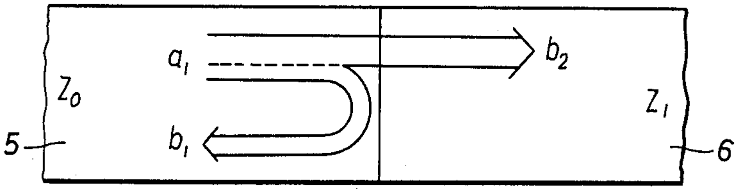
FIG. 2 illustrates a discontinuity between two waveguides.

The discontinuity shown in FIG. 2 shows the division of the signal a1 into a signal component b1 reflected at the discontinuity, and a signal component b2 passing through it. Such a division of the signal occurs both at the waveguide taps or three-gates due to an inevitable mismatch and at the junctions between waveguides of unequal wave resistance.

Figure 3A:
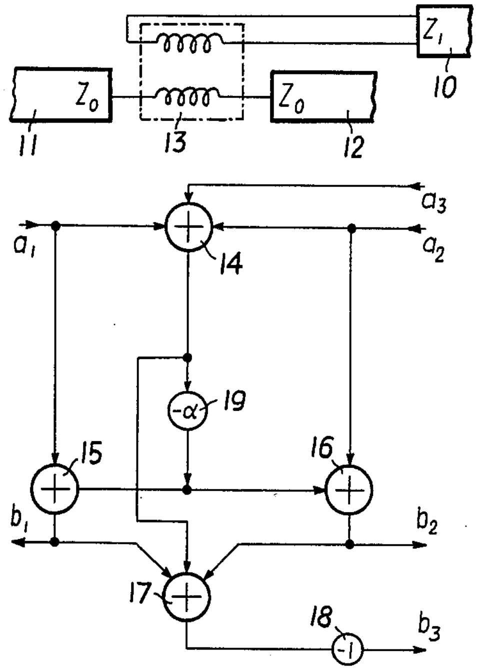
FIG. 3*a* is a diagram of a serial three-gate adapter.

FIG. 3*a* shows a serially tapped line section 11, 12 (the ideal transformer coil 13 is not necessary in principle and has been inserted only for the sake of illustration). The digital realization implementation of a serial tap is termed a serial three-gate adapter and consists of the adders 14, 15, 16 and 17, the sign inverter 18, and the multiplier 19. The wave resistance ratio (or characteristic impedance ratio) between the tapped and tapping lines is determined by the multiplier coefficient $$\alpha = \frac{2Z_0}{2Z_1 + Z_0}.$$

where $Z_0$ is the characteristic impedance of the tapped line, and $Z_1$ the characteristic impedance of the tapping line at 10.

Figure 3B:
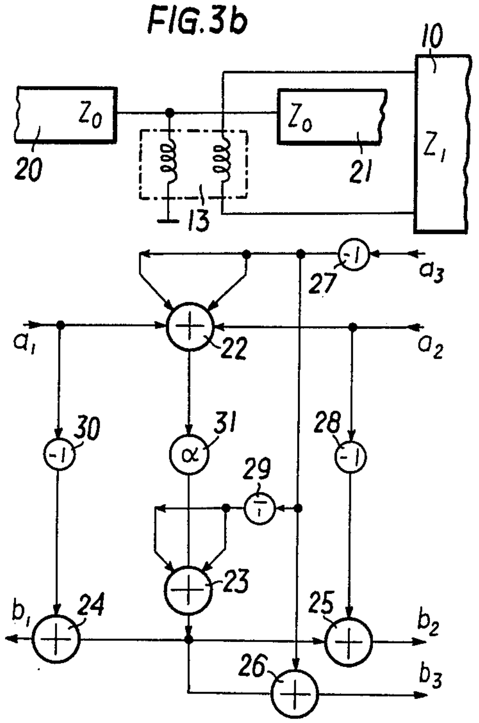
FIG. 3*b* is a diagram of a shunt or parallel three-gate adapter.

FIG. 3*b* shows the parallel tapped line section 20, 21.

The digital implementation of a parallel line linkage is termed a parallel three-gate adapter and consists of the adders 22, 23, 24, 25 and 26 the sign inverters 27, 28, 29, 30, and the multiplier 31. The multiplier coefficient is given by the $$\text{equation} = \frac{2G_0}{2G_1 + G_0}.$$

value ($G_0$ and $G_1$ are the conductivities of the tapped and tapping lines corresponding to the wave resistances or characteristic impedances $Z_0$ abd $Z_1$). Naturally the three-gate adapters can be inserted also between line sections of different wave resistance. But such an arrangement offers no particular advantages and has an adverse effect on the computing time and the S/N (signal to noise) ratio, as in this case the three-gate adapter requires an additional multiplier.

Figure 4A:
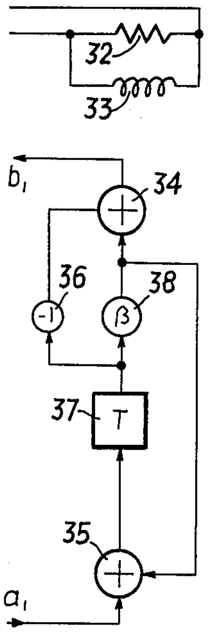
FIG. 4*a* and 4*b* are diagrams of an absorber with parallel-connected reactance and ohmic resistance respectively.

FIG. 4*a* shows an absorber with rising absorption frequency response, which consists of the parallel connection of an inductance 33 and an ohmic resistance 32 and whose digital circuit is composed of the adders 34, 35, the sign inverter 36, the delay section 37, and the multiplier 38.

Figure 4B:
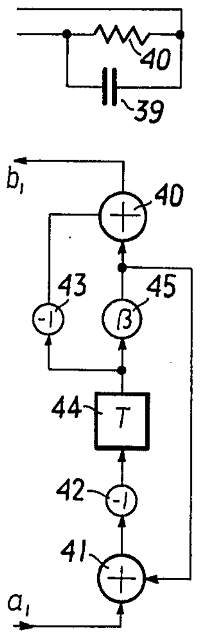

FIG. 4*b* shows a absorber with falling absorption frequency response, which consists of the parallel connection of a capacitance 39 and of an ohmic resistance 40, and whose digital circuit differs from the above described circuit only by an additional sign inverter 42. The circuit of FIG. 4*b* otherwise includes adders 40, 41, sign inverter 43, delay section 44 and multiplier 45.

Figure 4C:
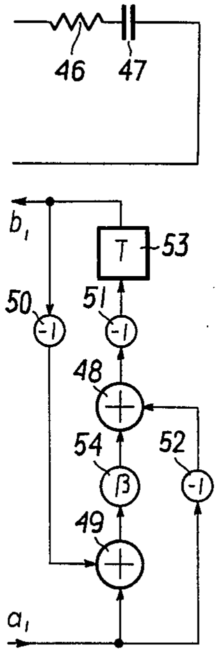
FIG. 4*c* and 4*d* are diagrams of an absorber with series-connected reactance and ohmic resistance respectively.

FIG. 4*c* shows an absorber with rising absorption frequency response, composed of an ohmic resistance 46 and a capacitance 47 connected in series therewith.

Figure 4D:
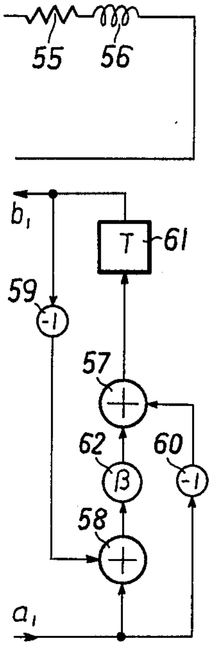

FIG. 4*d* shows an absorber with falling absorption frequency response composed of a resistance 55 and an inductance 56 connected in series therewith.

In FIG. 4*c*, the digital circuit comprises adders 48, 49, sign inverters 50, 51, 52, time delay 53 and multiplier 54. The digital circuit of FIG. 4*d* comprises adders 57, 58, sign inverters 59, 60, time delay 61 and multiplier 62.

The frequency-dependent absorption is due to the fact that, for example when the dissipative resistance is bridged or shunted by an inductance, the low-frequency signal components flow over the inductance more or less unhindered, whereas higher-frequency components are forced into the dissipative resistance and are partially absorbed there. The opposite reverberation time frequency response is obtained by replacing the inductance by a capacitance. It would be possible to add two further absorber types with a serial or parallel resonant circuit as reactance, but they are of no practical significance because of their unnatural absorption frequency response. The basic theory on absorber circuits is found in the "Journal of the Franklin Institute", vol. 300, No. 1, July 1975, p. 41-58.

Figure 5:
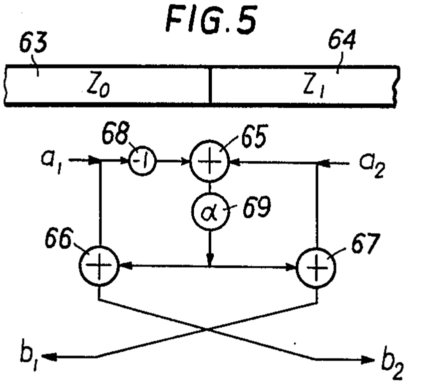
FIG. 5 is a diagram a line consisting of two sections of different wave resistance.

FIG. 5 illustrates the digital implementation of a discontinuity which is formed at the junction between line section 63, with wave resistance $Z_0$, and line section 64, with wave resistance $Z_1$. The circuit, referred to as two-gate adapter, consists of the adder circuits 65, 66 and 67, sign inverter 68, and multiplier 69. The multiplier serves to multiply the signals entering the point of discontinuity by the reflection factor $\alpha=(Z_p-Z_1)/(Z_0+Z_1)$.

Figure 6:
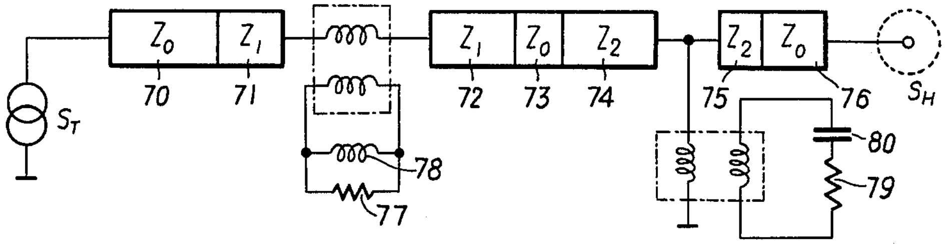
FIG. 6 is a block diagram of the first embodiment of the invention.

FIG. 6 shows an embodiment which consists of a reflectingly terminated line fed from a current source, composed of the sections 70, 71, 72, 73, 74, 75 and 76 of different wave resistance and different length. In one section, 71, 72, an absorber consisting of the parallel connection of a resistance 77 and inductance 78 is serially inserted, while another section 74, 75 is connected in parallel with the series connection of a resistance 79 and capacitance 80.

Figure 7A:
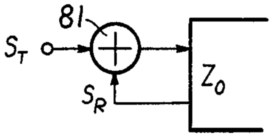
FIG. 7*a* is a diagram of the digital circuit of the recording point in the first embodiment.

The digital recording circuit of the first embodiment shown in FIG. 7*a* consists only of an adder 81, which forms the sum of the reflected signal $S_R$ and the recorded signal $S_T$ and whose output is connected to the input of the one-dimensional waveguide.

Figure 7B:
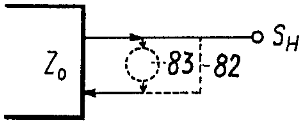
FIG. 7*b* shows the digital circuit of the reverberation pickup in the first embodiment.

FIG. 7*b* shows the digital termination circuit and the reverberation pickup of the first embodiment, the reverberated signal $S_H$ being picked up at the output of the waveguide and returned into the line via the connection 82. It is also possible to return the signal $S_H$ via an absorber 83 as noted above.

Figure 7C:
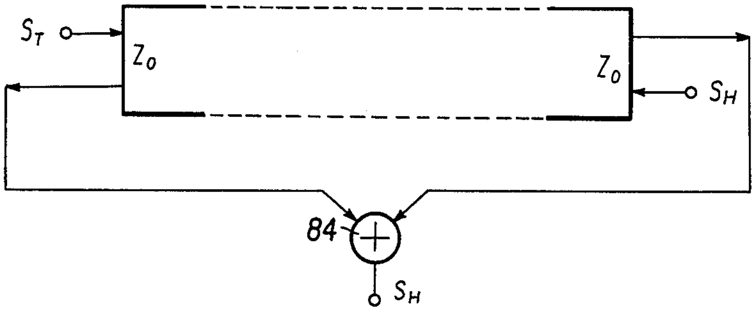
FIG. 7*c* shows a variant of the first embodiment with symmetrical reverberation recording and pickup.

FIG. 7*c* shows a variant of the first embodiment where the signal is recorded and picked up at both ends of the waveguide. The actual output signal $S_H$ is obtained by the formation of the difference of the two output signals in adder 84. The advantages of the symmetrical arrangement are discussed in reference to the next embodiment.

Figure 8:
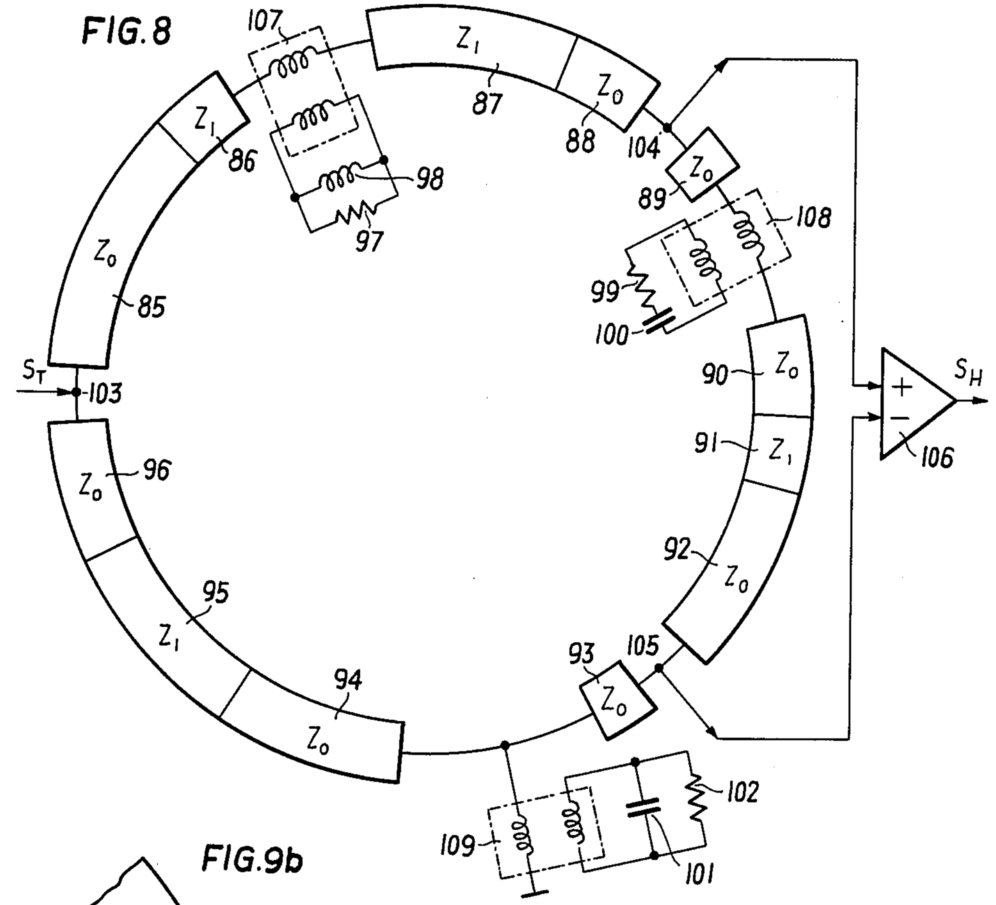
FIG. 8 is a block diagram of a second embodiment of the invention.

FIG. 8 shows the second embodiment of the invention, which consists of a "circular" one-dimensional waveguide composed of several line sections 85 to 96 of different lengths and different wave resistances. In section 86, 87, an absorber consisting of an inductance 98 and resistance 97 is inserted serially, while in section 89, 90 an absorber consisting of a resistance 99 and capacitance 100 is inserted serially, and at section 93, 94 an absorber composed of a resistance 102 and capacitance 101 is connected.

The unreverberated signal $S_T$ is applied at a point of the ring line 103 and propagates in both directions. At the discontinuity junctions it is partially reflected and partially absorbed in the dissipative resistances shunted by inductances and capacitances. If, for example, a pulse is impressed on the ring line, it is split into two pulses traveling through the ring line in opposite directions. The two pulses simultaneously reach the taps 104 and 105, arranged symmetrical to the feed point, and from there they are supplied to a subtractor 106, which eliminates them due to the fact that they are subtracted from each other. The reflected or reverberated components of the pulse, however, are not eliminated by the subtractor 106, as the discontinuity points ae arranged non-symmetrically to the feed point 103. After several revolutions the two oppositely running pulses are completely frayed out at the discontinuity points into reflected components, so that they supply the reverberated signal $S_H$. It is easy to see that with so few discontinuity points as are shown in the embodiment of FIG. 8 one cannot produce a very diffused reverberation. For good reverberant quality the ring line must be composed of at least fifty line sections of different wave resistance and statistically distributed length. Also a larger number of uniformly distributed absorbers is necessary to prevent the formation of isolated points on the line in which the energy is not greatly absorbed.

Figure 9B:
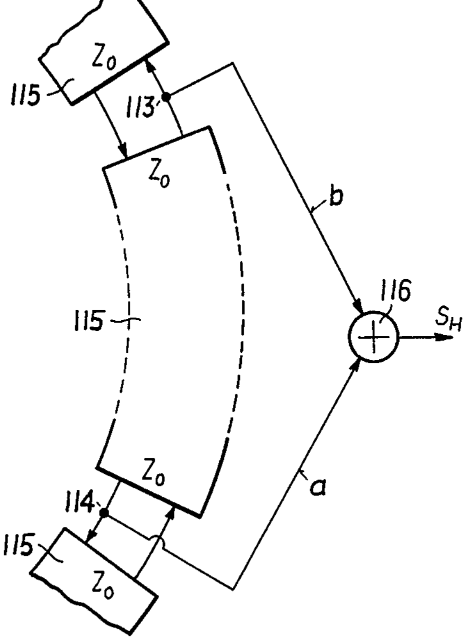
FIG. 9*b* is a diagram of the digital circuit of the reverberation pickup in the second embodiment.
Figure 9A:
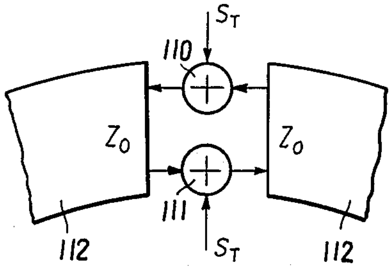
FIG. 9*a* is a diagram of the digital circuit of the recording point in the second embodiment.

FIG. 9a shows the digital circuit of the recording point for the second embodiment. It consists of the adder circuits 110 and 111, through which the unreverberated signal $S_T$ is fed symmetrically into the "circular" waveguide 112, 112.

FIG. 9b shows the digital circuit of the reverberation pickup for the second embodiment. It consists of an adder circuit 116 which is connected to two pickup points 113, 114 symmetrical which are to the recording point, of opposite direction of signal propagation, and which compensates the unreverberated signal and the echoes thereof, with the possibility that the number of symmetrically arranged pickup points may be more than two.

To summarize, it may be stated that due to the digital value of a one-dimensional waveguide with discontinuity points and absorbers it is now possible to reverberate a signal diffusely and with programmable reverberation time frequency response, without the disadvantage of a reduction of the S/N ratio by limit cycles.

I claim:

1. A device for producing artificial reverberation from a digital signal, comprising:

a one-dimensional waveguide formed of digital circuits and simulating at least two line sections of different lengths by having different delay periods, said line sections having first ends facing each other;

each line section comprising two digital delay lines running parallel with each other, one for each direction of propagation in said waveguide;

at least one three-gate adapter of the wave digital filter type, having three gates and arranged between said first ends of said at least two line sections, one of said gates of said three-gate adapter connected to each of said first ends of said at least two line sections; and a frequency-dependent absorber of the digital type connected to and closing off the remaining gate of said three-gate adapter;

at least one of said two line sections having a second end for receiving the digital signal.

2. A device according to claim 1, wherein both of said at least two line sections have a second end, said second ends connected to each other.

3. A device according to claim 2, including a two-gate adapter connected between said second ends of said at least two line sections.

4. A device according to claim 2, including a three-gate adapter connected between said second ends of said at least two line sections.

5. A device according to claim 2, including a first and a second adder connected between said second ends of said at least two line sections, said first adder having a first input connected to an output of one digital delay line of one of said line sections and an output connected to an input of one digital delay line of the other of said at least two line sections, said second adder having a first input connected to an output of the delay line of said other of said line sections and an output connected to an input of the other delay line of the one of the line sections, each of said first and second adder having a second input for receiving the digital signal.

6. A device according to claim 5, including a third adder having two inputs, one input, as seen in one direction of propagation, connected to an output of a delay line of one of said line sections, and the other input of said third adder, as seen in the other direction of propagation, connected to an output from a delay line of the line section, a reverberated output available at an output of said third adder.

7. A device according to claim 6, wherein a time delay between said first adder and said third adder viewed in a respective direction of propagation, is equal to a delay time between said second adder and said third adder viewed in an opposite direction of propagation.

8. A device according to claim 2, including an adder having two inputs, one input, as seen in one direction of propagation, connected to an output of a delay line of one of said line sections, and the other input of said adder, as seen in the other direction of propagation, connected to an output from a delay line of the line section, a reverberated output available at an output of said adder.

9. A device according to claim 1, including an adder connected to said second end of said at least one of said two line sections, said second end including an input for receiving the digital signal and an output, said input connected to one of said two digital delay lines of said at least one said two line sections, said output connected to the other of said two digital delay lines of said at least one of said two line sections, said adder having one input for receiving the digital signal, a second input connected to said output for receiving a reflected signal and an output connected to said input of said one of said two digital delay lines.

10. A device according to claim 9, wherein said one-dimensional waveguide includes said second end as one end thereof, said waveguide including another end, said other end of said waveguide including an output from one of said two digital delay lines of one of said two line sections terminating at said other end, and an input into the other of said two digital delay lines of said line section terminating at said other end, said output connected to said input at said other end of said waveguide.

11. A device according to claim 10, including an absorber connected between said output and said input at said other end of said waveguide.

12. A device according to claim 1, wherein said frequency dependent absorber comprises a one-gate digital circuit including a digitally obtained ohmic resistance and inductance connected in parallel.

13. A device according to claim 12, wherein said one-gate digital circuit includes a first adder, a delay section, a multiplier and second adder connected in series with each other, said multiplier having an output connected to a second input of said first adder, a first input of said first adder connected to an input of said one-gate digital circuit, said delay section having an output connected to a second input of said second adder with a sign inverter connected between said delay section output and said second input of said second adder, a first input of said second adder connected to an output of said one-gate digital circuit.

14. A device according to claim 1, wherein said frequency dependent absorber comprises a one-gate digital circuit including a digitally obtained ohmic resistance and capacitor connected in parallel.

15. A device according to claim 14, wherein said one-gate digital circuit comprises a first adder, a sign inverter, a delay section, a multiplier and a second adder connected in series, an output of said multiplier connected to a second input of said first adder, a first input of said first adder connected to an input of said one-gate circuit, an output of said delay section connected to a second input of said second adder over a second sign inverter, a first input of said second adder connected to an output of said one-gate digital circuit.

16. A device according to claim 1, wherein said frequency dependent absorber comprises a one-gate digital circuit including a digitally obtained ohmic resistance and capacitance connected in series.

17. A device according to claim 16, wherein said one-gate digital circuit comprises a first adder, a multiplier, a second adder, a sign inverter and a delay section connected in series, an output of said one-gate digital circuit connected to a second input of said first adder over a second sign inverter, said output of said one-gate digital circuit connected to an output of said delay section, an input of said one-gate digital circuit connected to one input of said first adder, and said input of said one-gate digital circuit connected to a second input of said second adder over a third sign inverter.

18. A device according to claim 1, wherein said frequency dependent absorber comprises a one-gate digital circuit including a digitally obtained ohmic resistance and inductance connected in series.

19. A device according to claim 18, wherein said one-gate digital circuit comprises a first adder, a multiplier, a second adder and a delay section connected in series from an input of said one-gate digital circuit to an output of said one-gate digital circuit, a first input of said first adder connected to said input of said one-gate digital circuit, said output of said one-gate digital circuit connected over a first sign inverter to a second input of said first adder and a second input of said second adder connected to said input of said one-gate digital circuit over a second inverter.

20. A device for producing artificial reverberation from a digital signal comprising:

a one-dimensional waveguide formed of digital circuits and simulating at least two line sections of different lengths by having different delay periods, said line sections having ends facing each other;

each line section comprising two digital delay lines running parallel with each other, one for each direction of propagation in said waveguide; and at least one two-gate adapter of the wave digital filter type having two gates and being arranged between the ends facing each other of said at least two line sections, one gate of said two-gate adapter being connected to each of the two ends facing each other of said two line sections, said two-gate adapter transmitting a part of the digital signal from one line section to the other and reflecting part of the digital signal back to the line section from which it came.

* * * * *